(12) United States Patent
Leobandung

(10) Patent No.: US 10,930,579 B2
(45) Date of Patent: Feb. 23, 2021

(54) SELF-CONTAINED LIQUID COOLED SEMICONDUCTOR PACKAGING

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/796,331

(22) Filed: Feb. 20, 2020

(65) Prior Publication Data
US 2020/0194339 A1    Jun. 18, 2020

Related U.S. Application Data

(63) Continuation of application No. 16/008,440, filed on Jun. 14, 2018, now Pat. No. 10,622,283.

(51) Int. Cl.
  *H01L 23/473* (2006.01)
  *H01L 23/367* (2006.01)
  *H01L 23/433* (2006.01)
  *H05K 7/20* (2006.01)

(52) U.S. Cl.
  CPC .......... *H01L 23/433* (2013.01); *H01L 23/367* (2013.01); *H01L 23/473* (2013.01); *H05K 7/20272* (2013.01); *H05K 7/20236* (2013.01); *H05K 7/20245* (2013.01)

(58) Field of Classification Search
  CPC ........ H01L 23/476; H01L 23/44; H01L 23/46
  USPC .............. 361/701, 679.46–679.54, 688–721; 165/80.4–80.5, 104.33; 174/547–548; 257/714
  See application file for complete search history.

(56) References Cited

U.S. PATENT DOCUMENTS

| | | |
|---|---|---|
| 5,184,211 A | 2/1993 | Fox |
| 6,085,831 A | 7/2000 | DiGiacomo et al. |
| 6,214,647 B1 | 4/2001 | Di Giacomo et al. |
| 6,600,651 B1 | 7/2003 | Weng |
| 7,082,778 B2 | 8/2006 | Patel et al. |
| 7,218,000 B2 | 5/2007 | Houle |
| 7,219,715 B2 | 5/2007 | Popovich |
| 7,369,410 B2 | 5/2008 | Chen et al. |
| 8,014,150 B2 * | 9/2011 | Campbell .......... H05K 7/20809 361/700 |
| 8,059,405 B2 * | 11/2011 | Campbell ........... F28D 15/0266 165/104.33 |

(Continued)

OTHER PUBLICATIONS

List of IBM Patents or Patent Applications Treated as Related dated Feb. 20, 2020, 2 pages.

*Primary Examiner* — Zachary Pape
*Assistant Examiner* — Amir A Jalali
(74) *Attorney, Agent, or Firm* — Tutuniian & Bitetto, P.C.; Robert Sullivan

(57) ABSTRACT

A liquid cooled semiconductor package and method for forming a liquid cooled semiconductor package is described. The device includes at least one semiconductor device mounted on a substrate. An impermeable housing is disposed on the substrate with an internal cavity. A liquid coolant is within the internal cavity such that the coolant immerses at least one semiconductor device.

19 Claims, 12 Drawing Sheets

(56) References Cited

U.S. PATENT DOCUMENTS

| | | | | |
|---|---|---|---|---|
| 8,194,406 B2* | 6/2012 | Campbell | ............... | H05K 7/203 |
| | | | | 361/698 |
| 8,345,423 B2* | 1/2013 | Campbell | ........... | F28D 15/0233 |
| | | | | 361/699 |
| 8,490,679 B2* | 7/2013 | Campbell | ............... | F28D 15/02 |
| | | | | 165/80.2 |
| 8,619,425 B2* | 12/2013 | Campbell | .......... | H05K 7/20809 |
| | | | | 165/80.4 |
| 8,713,957 B2* | 5/2014 | Campbell | ............... | F25B 21/02 |
| | | | | 62/259.2 |
| 8,739,406 B2* | 6/2014 | Campbell | ............... | B23P 15/26 |
| | | | | 29/890.07 |
| 8,806,749 B2* | 8/2014 | Campbell | ............... | F28D 15/02 |
| | | | | 29/890.032 |
| 8,953,317 B2* | 2/2015 | Campbell | ............... | H05K 7/203 |
| | | | | 165/104.33 |
| 8,953,320 B2* | 2/2015 | Campbell | .......... | H05K 7/20809 |
| | | | | 165/104.21 |
| 9,250,024 B2* | 2/2016 | Campbell | ............... | F28F 3/048 |
| 9,441,308 B2 | 9/2016 | Ludwig | | |
| 9,516,792 B2* | 12/2016 | Krishnan | ........... | H05K 7/20772 |
| 10,194,559 B2* | 1/2019 | Saito | .................... | H05K 5/0026 |
| 10,321,609 B2* | 6/2019 | Hirai | .................. | H05K 7/20236 |
| 2006/0118279 A1 | 6/2006 | Stafford | | |

* cited by examiner

SELF-CONTAINED LIQUID COOLED SEMICONDUCTOR PACKAGING

BACKGROUND

Technical Field

The present invention generally relates to semiconductor packaging, and more particularly to self-contained liquid cooled semiconductor packaging.

Description of the Related Art

Semiconductor devices, such as, e.g., processors and memory devices, generate heat during operation due to resistance in wiring and transistors. This heat can degrade the performance of the device and possibly even damage materials of the device chip. Thus, inadequate heat dissipation can be a limiting factor in device performance, especially is situations where stacked chips are used. Additionally, active liquid cooling solutions can be complex and difficult to assemble or fix.

SUMMARY

In accordance with an embodiment of the present invention, a liquid cooled semiconductor package is described. The device includes at least one semiconductor device mounted on a substrate. An impermeable housing is disposed on the substrate with an internal cavity. A liquid coolant is within the internal cavity such that the coolant immerses at least one semiconductor device.

In accordance with another embodiment of the present invention, a liquid cooled semiconductor package is described. The liquid cooled semiconductor package includes a first semiconductor device soldered onto on a substrate. A second semiconductor device is soldered onto the first semiconductor device on a side opposite to the substrate. An impermeable housing is disposed on the substrate and including a liquid coolant and the at least one semiconductor device immersed in the coolant. A convection structure for directing convective currents of the coolant is disposed within an internal cavity of the impermeable housing using openings formed in at least one wall of the convective structure such that the convective currents are directed from the first semiconductor device and the second semiconductor device around the convective structure, across a top portion of the impermeable housing, and back towards the first semiconductor device and the second semiconductor device through the openings.

In accordance with an embodiment of the present invention, a method for forming a liquid cooled semiconductor package is described. The method includes forming a cavity with an impermeable housing and a substrate. The cavity is filled with a liquid coolant. A semiconductor device mounted on the substrate is immersed in the liquid coolant.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
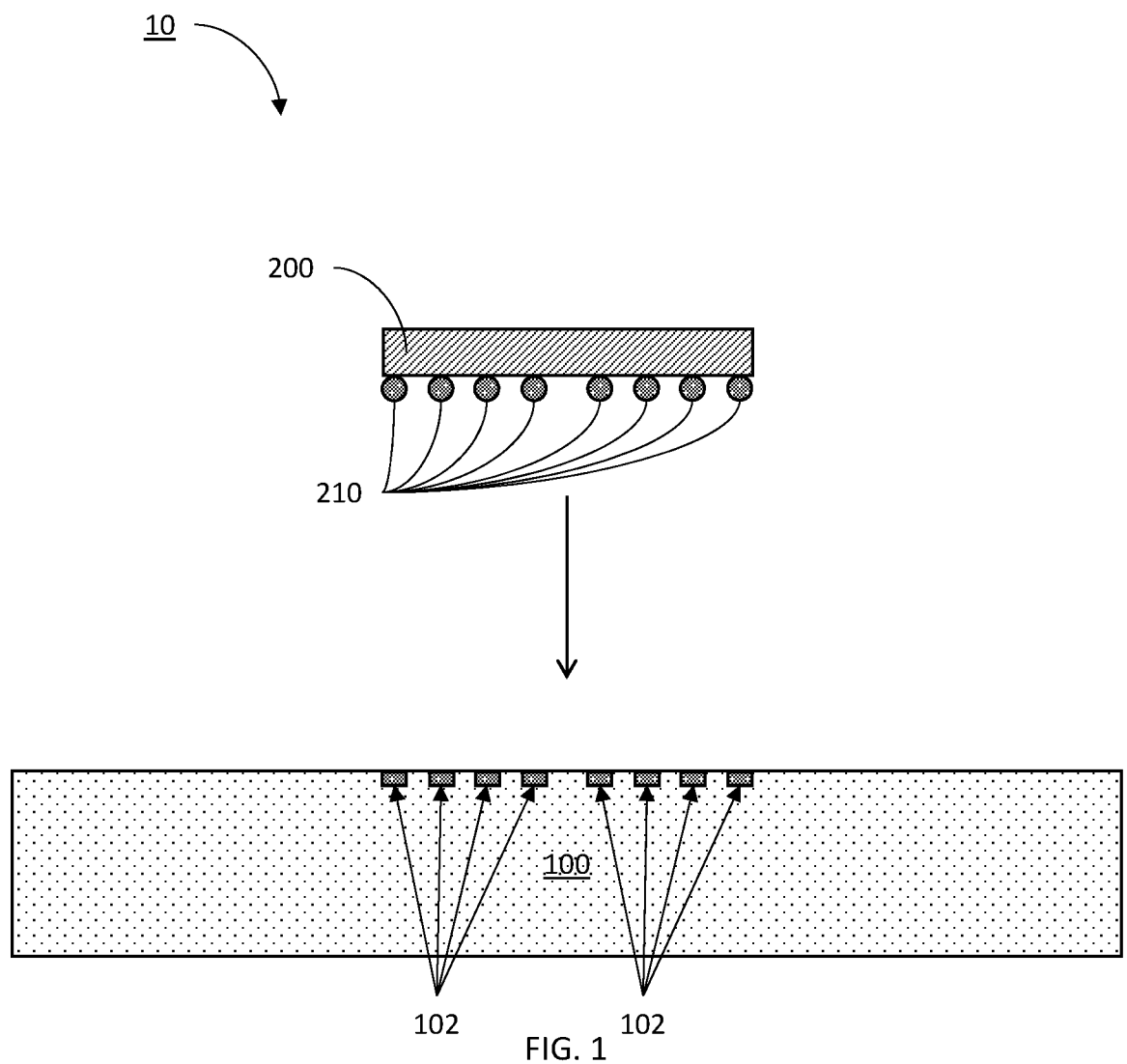
FIG. 1 is a cross-sectional view showing a semiconductor device being attached to a substrate, in accordance with an embodiment of the present invention.

According to aspects of the present invention, an embodiment of a self-contained liquid cooled semiconductor packaging is described that is both efficient at cooling one or more chips in the package, and simple to assemble and repair. The liquid for cooling the semiconductor device of the package is entirely contained within a housing.

The housing can be constructed from a single piece of heat conducting material and attached to the chip in a watertight fashion. By inverting the housing and filling the housing with a heat conducting fluid, the chip can then be flipped on the housing, creating a seal around a rim portion of the housing where the housing contacts a substrate. A chip affixed to the substrate is, therefore, immersed in the fluid without the need for any ports or piping to circulate fluid.

Indeed, convection within the fluid in the package can be leveraged. For example, the housing can form a cavity filled with the fluid such that the fluid circulates according to convection created by a temperature difference between the chip in the package and a heat sink attached to the housing. Therefore, the heat from the chip can be transferred to the fluid by convection, and the fluid can transfer the heat to the housing by convection, the housing can transfer the heat to the heat sink by conduction and the heat sink can convectively and radiatively dissipate the heat to the surrounding environment.

To facilitate with convection, the housing can also include channeling within the cavity that directs cool fluid towards the chip, and hot fluid away from the chip. Thus, convection in the fluid can be efficiently managed for more efficient heat dissipation.

Exemplary applications/uses to which the present invention can be applied include, but are not limited to: packaging for semiconductor devices, such as, e.g., packaging for computer processors, memory devices, graphical processors, systems-on-chip, among others.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view of a semiconductor device being attached to a substrate is depicted in accordance with an embodiment of the present invention.

The semiconductor device 200 can be any device for which packaging is useful. According to aspects of an embodiment of the present invention, such a device can include, e.g., a central processing unit (CPU), a microprocessor, a graphical processing unit (GPU), a system-on-chip (SoC), a memory chip, or any other semiconductor device and combinations thereof. The semiconductor device 200 is operated with electricity and has internal resistance according to materials of conductive structures. As such, in operation, the semiconductor device 200 will generate heat. The heat generated can affect the materials of the device 200 such that performance is degraded or the semiconductor device 200 is damaged, or both. Thus, cooling the semiconductor structure 200 can improve the reliability and performance of the semiconductor device 200. However, the semiconductor device 200 may not be large enough or designed to directly support any heat dissipating structure. Moreover, it can be beneficial to electrically connect the semiconductor device 200 to other devices, such as, e.g., other processing devices, memory device, etc. Therefore, the semiconductor device 200 can be attached to a package substrate 100 to facilitate packaging the semiconductor device 200 for applying heat dissipating structures and other devices.

According to aspects of the present invention, the package substrate 100 and the semiconductor device 200 can be formed separately and attached with, e.g., soldering. As such, solder balls 210 of the semiconductor device 200 are brought into contact with corresponding contact pads 102 on the substrate 100. The semiconductor device 200 can be brought in contact with the substrate 100 using a suitable technique, such as, e.g., pick-and-place or surface mount technology, among other processes.

The contact pads 102 can include contacts for metallizations that lead to other devices and connects on the substrate 100 or connected to the substrate 100. The contact pads 102, while depicted as being in the substrate 100, can alternatively be formed on top of a surface of the substrate 100. Thus, the contact pads 102 form a set of device contacts to facilitate connecting devices to form circuits and systems.

The package semiconductor 100 can include any suitable substrate structure, e.g., a printed circuit board (PCB), a bulk semiconductor, a semiconductor-on-insulator (SOI) substrate, etc. In one example, the substrate 100 can include a PCB for connected multiple separate devices together. Illustrative examples of materials suitable for the substrate 100 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

Figure 2:
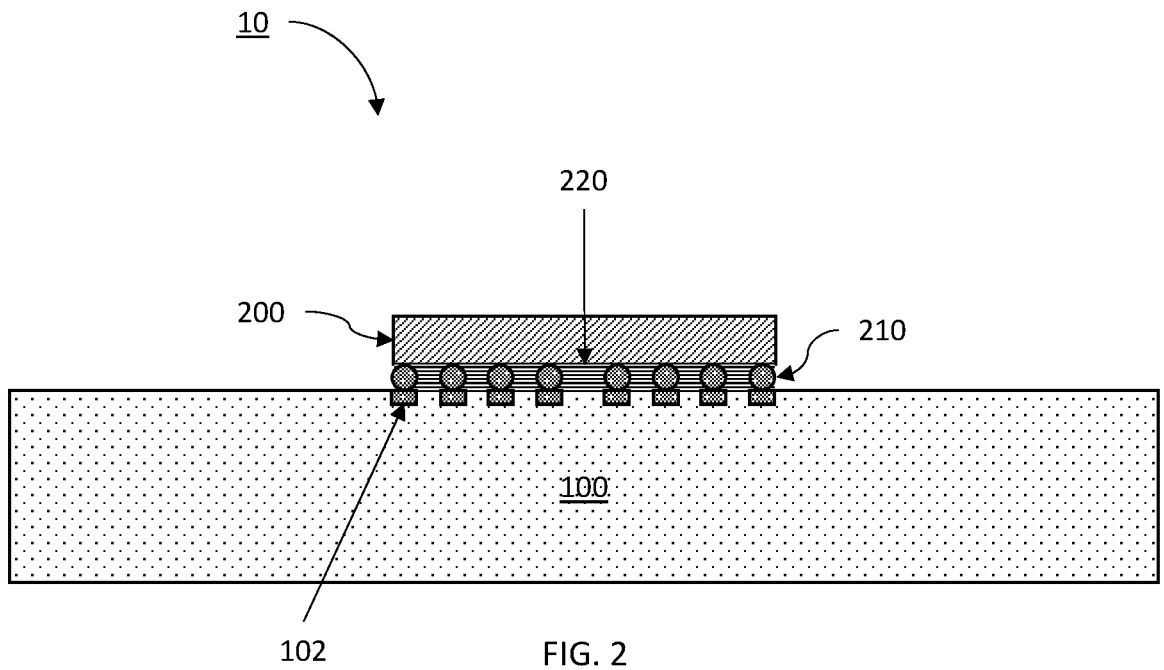
FIG. 2 is a cross-sectional view showing a semiconductor device attached to a substrate with an underfill, in accordance with an embodiment of the present invention.

Referring now to FIG. 2, a cross-sectional view of a semiconductor device attached to a substrate with an underfill is depicted in accordance with an embodiment of the present invention.

Once the semiconductor device 200 is attached to the substrate 100, the attachment is held in place via solder balls 210 soldered to contact pads 102. However, solder balls 210 can be fragile and are necessary for maintaining electrical contact with other devices attached through the contact pads 102 of the substrate 100. Therefore, to prevent damage to the solder balls 210 and protect and bolster the attachment of the semiconductor device 200 to the substrate 100, an underfill 220 can be provided in a gap between the semiconductor device 200 and the substrate 100 around the solder balls 210.

The underfill can be formed using an underfill process to flow a material into the gap. The underfill process can include, e.g., providing a melted polymer under heat to an edge of the semiconductor device, and flowing the melted polymer under the device 200 using capillary action. Underfill material can include, e.g., a liquid epoxy. However, other processes and material are contemplated. Because the process utilizes capillary action to provide a protective underfill 220 to encapsulate the solder balls 210, the underfill 220 can include a fluid that is curable. Thus, the fluid can flow into the gap by capillary action, and when cured, provide a protective encapsulation.

Figure 3:
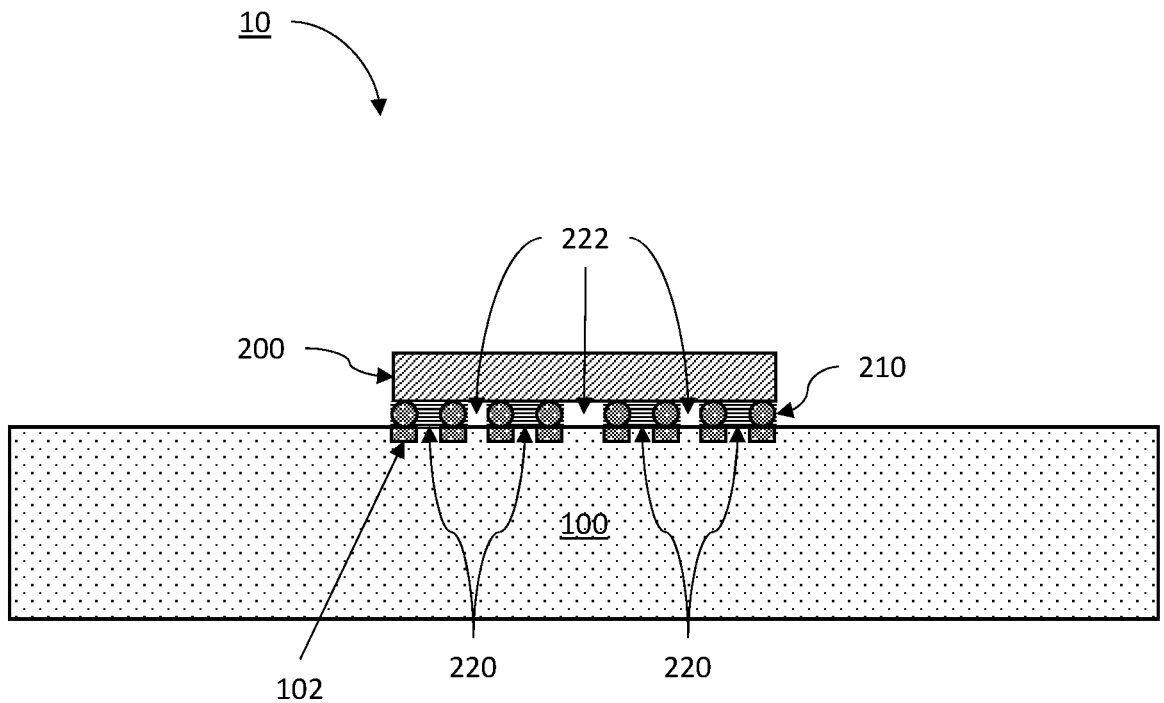
FIG. 3 is a cross-sectional view showing a semiconductor device being attached to a substrate with channels in an underfill, in accordance with an embodiment of the present invention.

Referring now to FIG. 3, a cross-sectional view of a semiconductor device being attached to a substrate with channels in an underfill is depicted in accordance with an embodiment of the present invention.

As discussed above, the semiconductor device 200 can generate heat under operation due to the flow of electricity through structures having a resistance. The heat generation includes structures such as the solder balls 210. Thus, the solder balls 210, in addition to the semiconductor device 200, are a source of performance degrading heat. Thus, cooling around the solder balls 210 can facilitate dissipating the heat generated by the solder balls 210 as well as the heat generated by the semiconductor device 200. However, the underfill 220 may be thermally insulative, or at least not sufficiently thermally conductive to dissipate heat before the heat causes performance degradation. Therefore, underfill channels 222 can be formed at intervals in the underfill 220. Therefore, heat can be dissipated from the gap between the semiconductor device 200 and the substrate 100 via channels formed by the underfill channels 222, once the gap is filled with liquid as proposed.

Figure 4:
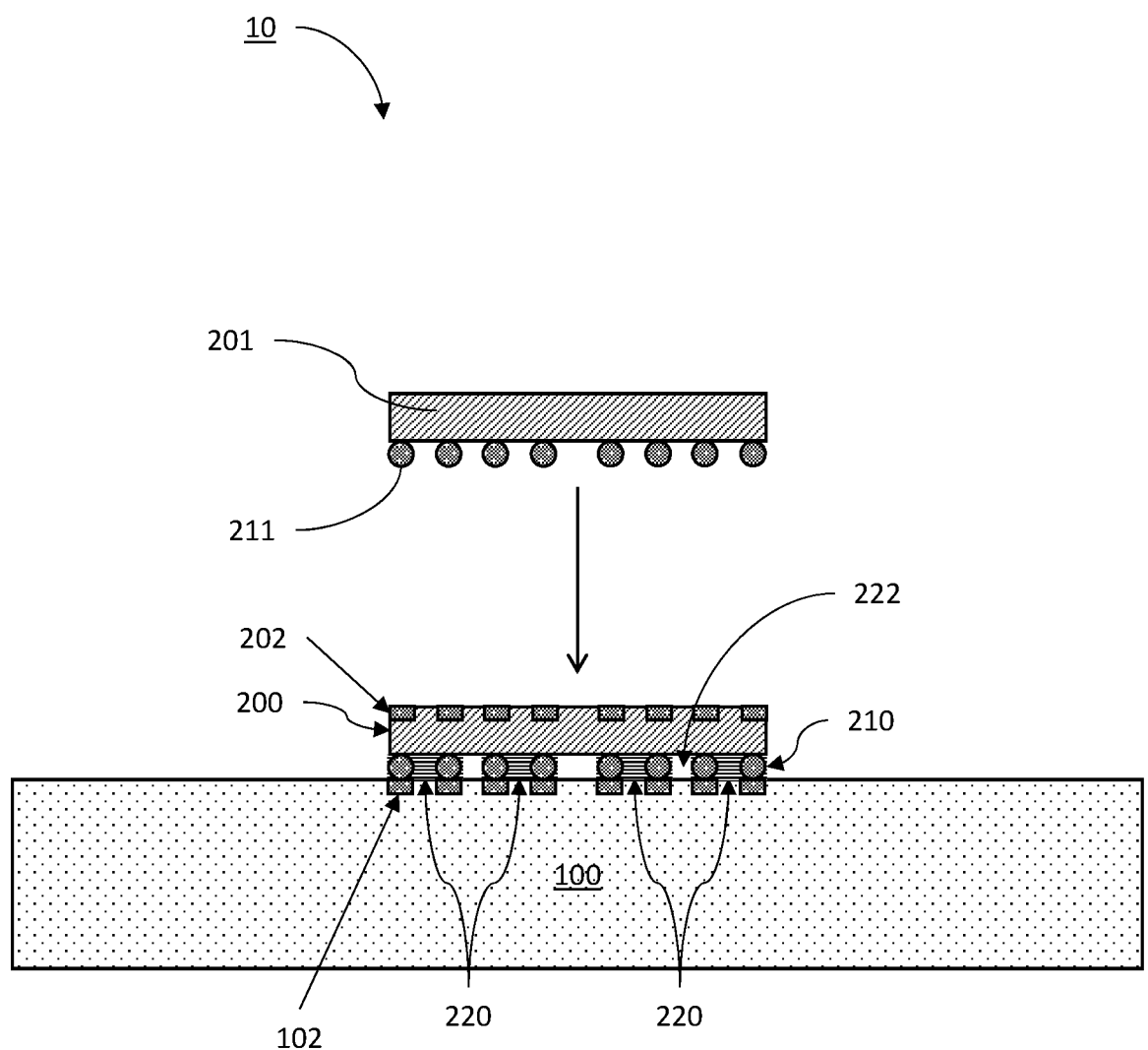
FIG. 4 is a cross-sectional view showing a second semiconductor device being attached to a semiconductor device and substrate combination, in accordance with an embodiment of the present invention.

Referring now to FIG. 4, a cross-sectional view of a second semiconductor device being attached to a semiconductor device and substrate combination is depicted in accordance with an embodiment of the present invention.

According to aspects of the present invention, a second semiconductor device 201 can be attached to the semiconductor package 10. Substrate 100 real-estate can be optimized by stacking semiconductor devices 200 and 201 together, rather than side-by-side. While, attaching the second semiconductor device 201 directly to the substrate 100 is possible, real-estate can be conserved by attaching the second semiconductor device 201 to the semiconductor 200, thereby stacking the devices 201 and 200 vertically.

Therefore, second solder balls 211 are brought into contact with device contact pads 202 on a top surface of the semiconductor device 200 to attach the second semiconductor device 201 to the semiconductor device 200 via the second solder balls 211 and device contact pads 202. The semiconductor device 200 can, therefore, include metallizations for communicating with the second semiconductor device 201 and for providing passthroughs to electrically connect the second semiconductor device 201 to the substrate 100. Similar to the contact pads 102 on the substrate, the contact pads 202 can form contacts for both the semiconductor device 200 for communicating with other semiconductor devices such as the second semiconductor device 201. The contact pads 202 can similarly form metallizations that facilitate connecting the second semiconductor device 201 with the substrate 100 via the solder balls 210 and the contact pads 102. Therefore, the second semiconductor device 201 can also communicate with other devices connected to the substrate 100 despite being mounted on the semiconductor device 200.

As many semiconductor devices as desired can be stacked in this fashion. Accordingly space on the substrate 100 is conserved, facilitating smaller package sizes.

Figure 5:
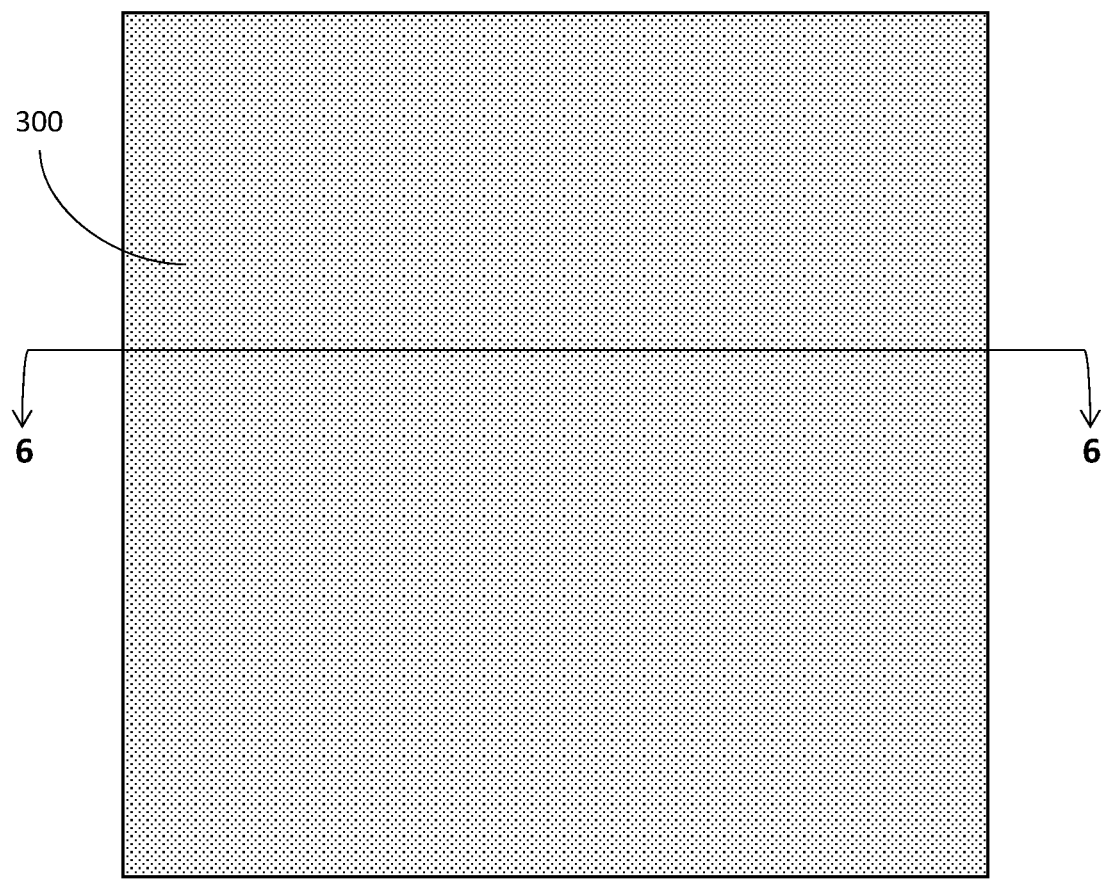
FIG. 5 is a top view showing a semiconductor package housing, in accordance with an embodiment of the present invention.

Referring now to FIG. 5, a top view of a semiconductor package housing is depicted in accordance with an embodiment of the present invention.

According to aspects of the present invention, a housing 300 for semiconductor packages, such as semiconductor package 10 is formed. The housing 300 will cover the semiconductor device 200 or devices 200 and 201 on the substrate 100 to protect the device 200 or devices 200 and 201 as well as facilitate heat dissipation. Accordingly, the housing 300 can include any suitable material for conducting heat from an interior to an exterior. For example, the housing 300, can include, e.g., a metal or metal alloy such as copper (Cu) and alloys thereof.

The housing 300 can be square in footprint, as seen in the top down view of FIG. 5. However, other footprints are contemplated such that the housing 300 can completely encompasses the device 200 or devices 200 and 201 attached to the substrate 100.

Figure 6:
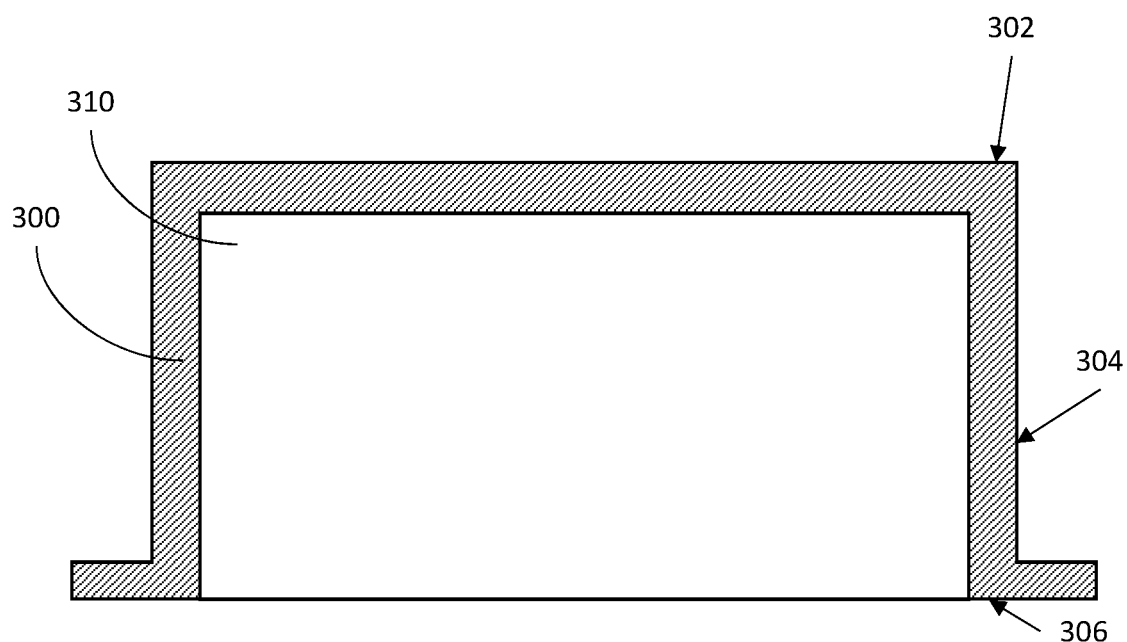
FIG. 6 is a cross-sectional view of cross section 5-5 of FIG. 4 showing a semiconductor package housing, in accordance with an embodiment of the present invention.

Referring now to FIG. 6, a cross-sectional view of cross section 6-6 of FIG. 5 of a semiconductor package housing is depicted in accordance with an embodiment of the present invention.

Regardless of the shape of the footprint of the housing 300, the cross-section of the housing 300 includes an interior cavity 310 for accommodating the devices 200 and 201. The interior cavity 310 is sized to accommodate any number of semiconductor devices, either in stacked configuration or side-by-side. According to aspects of the present invention, the housing 300 includes an interior cavity 310 sized to accommodate the semiconductor device 200 and the second semiconductor device 201 in a stacked configuration. Thus, the cross-section of the housing 300 can be rectangular in shape. However, other shapes are possible, such as, e.g., square, cylindrical, triangular, tetrahedral, etc.

In the embodiment as depicted, according to aspects of the present invention, the housing 300 includes a top portion 302 with sidewalls 304 extending transverse to the housing 300. The sidewalls 304 are formed around the perimeter of the top portion 302 to enclose the interior cavity 310. At a bottom of each sidewall 304 is a rim 306 having a shape corresponding to a shape of the top portion 302. Moreover, the rim 306 can be contoured such that it corresponds to any contours on the substrate 100. For example, the substrate 100 can have a planar surface and the housing 300 can have a corresponding flat rim 306 for resting flush against the planar surface of the substrate 100.

The housing 300 can be formed by a suitable technique for creating the interior cavity 310. For example, the housing 300 can be, e.g., stamped from a piece of flat material, cast, welded from multiple materials, 3-dimensionally printed, among other techniques. The housing 300 can include a size selected to accommodate one or more semiconductor devices. Therefore, the housing 300 can be, e.g., a square, rectangle, circle, etc. in footprint having a size on the order of centimeters.

Figure 7A:
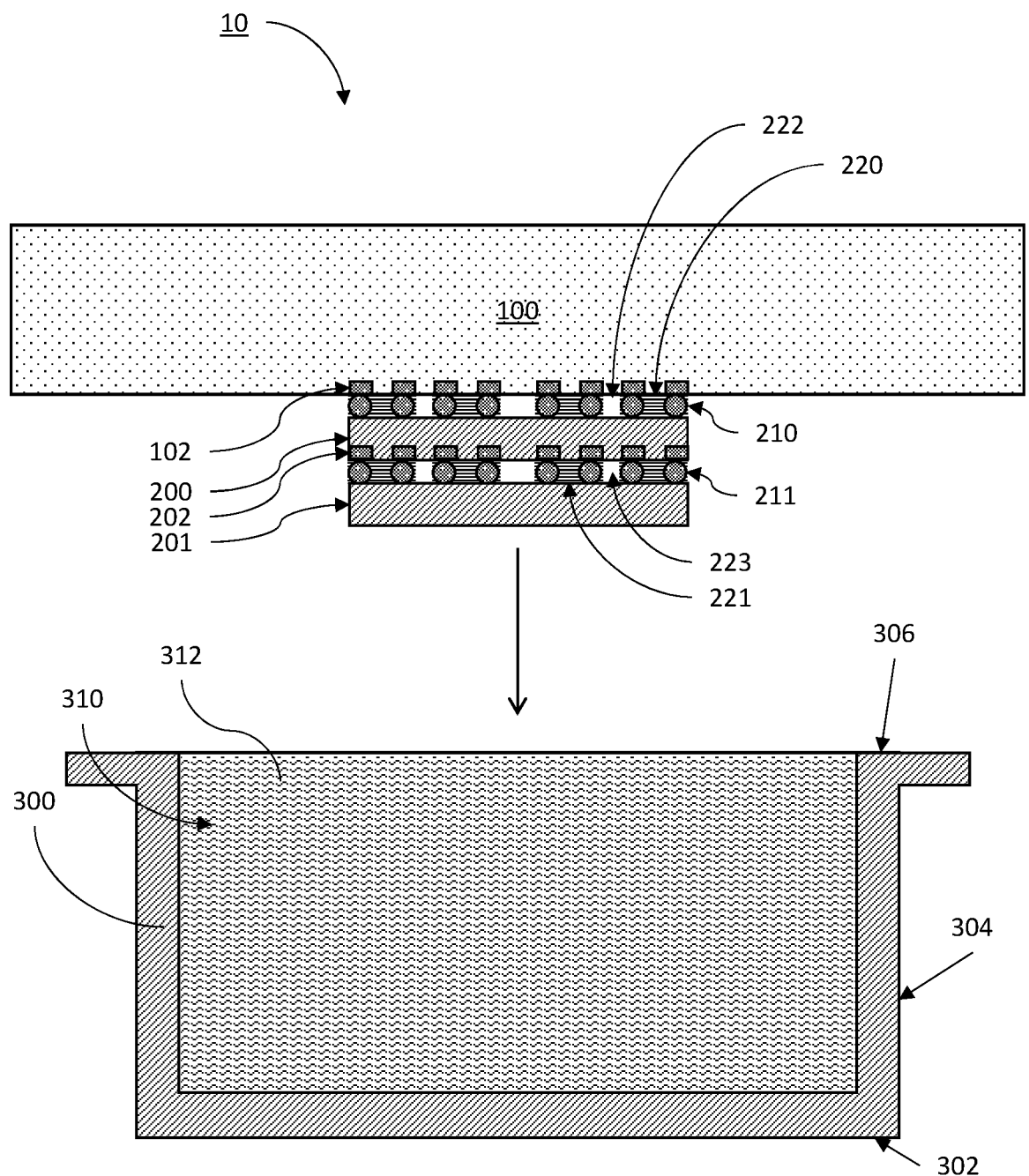
FIG. 7A is a cross-sectional view showing two stacked semiconductor devices stacks on a substrate and being lowered into a housing with a cavity containing a fluid, in accordance with an embodiment of the present invention.

Referring now to FIG. 7A, a cross-sectional view of two stacked semiconductor devices stacks on a substrate and being lowered into a housing with a cavity containing a fluid is depicted in accordance with an embodiment of the present invention.

To form the semiconductor package 10 with self-contained liquid cooling, the housing 300 can be inverted and the interior cavity 310 filled with a coolant 312 in liquid state. Fluids can be more effective at transporting heat from a high temperature area to a low temperature area than air or other gasses. However, some fluids contain electrolytes that make the fluid conductive and could short circuit or otherwise impair the semiconductor devices 200 and 201. Therefore, the semiconductor package 10 can include a fluid that will transport heat away from the high temperatures generated at the semiconductor devices 200 and 201 to the top portion 302 and sidewalls 304 of the housing 300, while also being electrically insulative to avoid interfering with electrical communications. Thus, the coolant 312 can include a liquid such as, e.g., alcohol, polymer liquid, or other heat conducting dielectric liquid.

Once the interior cavity 310 of the housing 300 is filled with coolant 312, the substrate 100 with the semiconductor devices 200 and 201 can be brought into contact with the housing 300 such that the semiconductor devices 200 and 201 are inserted into the interior cavity 310 and the coolant 312 therein, and the rim 306 interfaces with the substrate 100. The rim 306 can include an adhesive to attached the housing 300, via the rim 306, to the substrate 300. Any suitable impermeable adhesive may be used such that the interface between the rim 306 and the substrate 100 is impermeable to the coolant 312, thus preventing leaks. Thus, the semiconductor devices 200 and 201 will be entirely contained within a fluid filled cavity 310 of the housing 300.

Figure 7B:
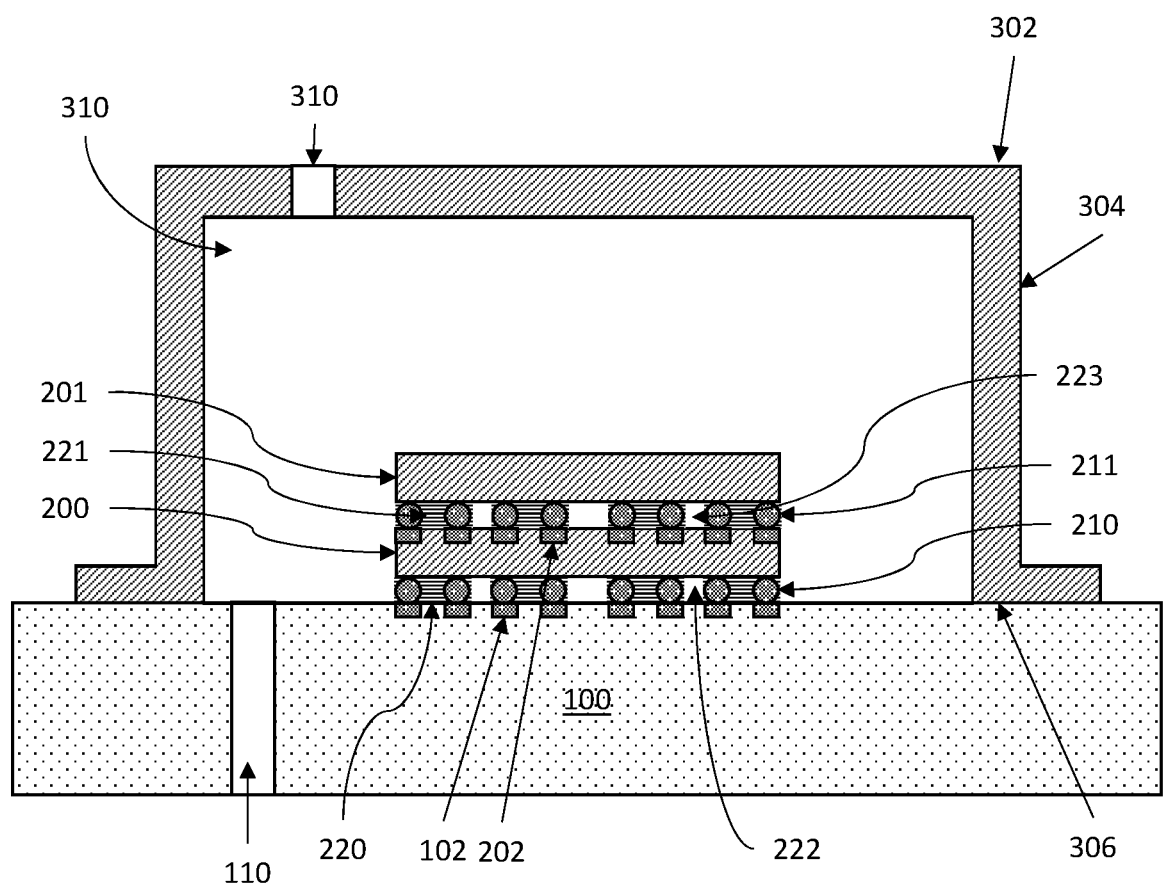
FIG. 7B is a cross-sectional view showing two stacked semiconductor devices stacks on a substrate situation on a substrate in a housing with a cavity to be filled with a fluid, in accordance with an embodiment of the present invention.

Referring now to FIG. 7B, a cross-sectional view of two stacked semiconductor devices stacks on a substrate situation on a substrate in a housing with a cavity to be filled with a fluid is depicted in accordance with an embodiment of the present invention.

Another possible embodiment according to aspects of the present invention includes attaching the housing 300 to the substrate 100 prior to filling the internal cavity 310 with fluid. A hole 110 is drilled into the substrate 100. The coolant 312 can be injected into the internal cavity 310 via, e.g., a pump or syringe or other liquid introduction device. Upon filling the internal cavity 310, the hole can be patched with, e.g., a dielectric material or adhesive. Additionally, the housing 300 can also include a hole 310. The hole 310 can be used in conjunction with, or instead of, the hole 110 for introducing the coolant 312 into the internal cavity 310. For example, coolant 312 can be injected into the internal cavity 310 through hole 110, while a vacuum is created via hole 310, or vice versa, to facilitate the introduction of coolant 312 into the internal cavity 310. Similar to hole 110, hole 310 can then be plugged with, e.g., a dielectric material or other leak-tight material, such as a polymer, metal or rubber.

Figure 8:
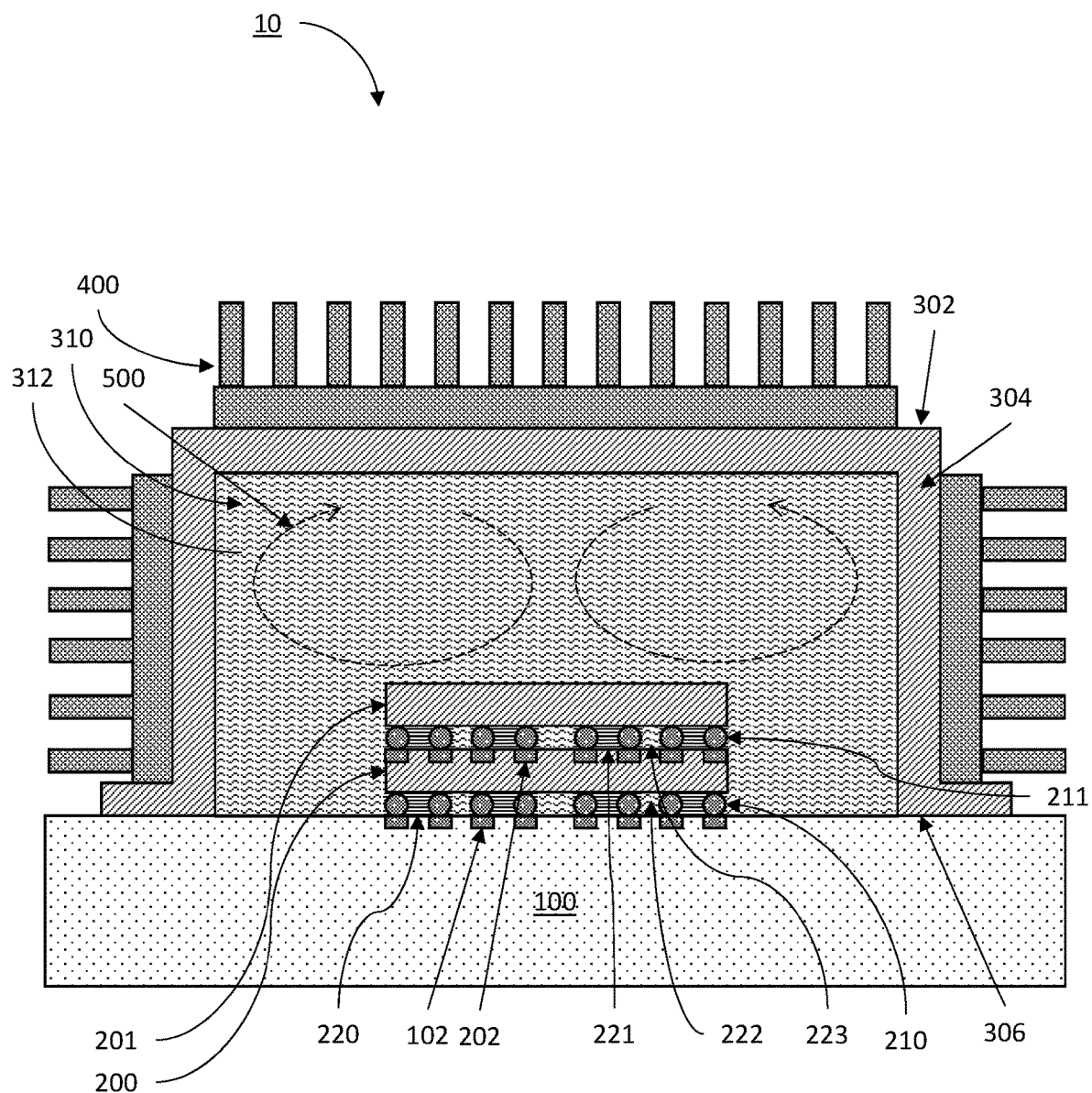
FIG. 8 is a cross-sectional view showing a semiconductor package having two stacked semiconductor devices in a fluid filled cavity of a housing and a heat sink on the housing, in accordance with an embodiment of the present invention.

Referring now to FIG. 8, a cross-sectional view of a semiconductor package having two stacked semiconductor devices in a fluid filled cavity of a housing and a heat sink on the housing is depicted in accordance with an embodiment of the present invention.

According to aspects of the present invention, the semiconductor package 10 includes the package substrate 100, two stacked semiconductor devices 200 and 201 formed on the package substrate 100, and a housing 300 encapsulating the two semiconductor devices 200 and 201 in an internal cavity 310. The two semiconductor devices 200 and 201 are, therefore, fully immersed in a single-state coolant 312 within the internal cavity 310. As discussed above, the housing 300 can be attached to the package substrate 100 with an adhesive on the rim 306. However, other attachment methods are contemplated, such as, e.g., screws or clamps, and gaskets or seals formed on the rim 306.

Thus, the semiconductor package 10 provides a passive cooling system with no fluid inlets, outlets or complicated mechanisms for circulating fluid. Rather, natural convection of the coolant 312 transports heat generated by semiconductor devices 200 and 201 to the housing 300. Because the underfill 220 and 221 include underfill channels 222 and 223, respectively, the coolant 312 can contact the semiconductor devices 200 and 200 on all sides. Thus, the surface area of the semiconductor devices 200 and 201 are maximized for more efficient heat transfer to the coolant 312. The coolant 312 can then circulate to lower temperature areas in the internal cavity 310 due to convective action 500, thus carrying the heat away from the semiconductor devices 200 and 201 and to the housing 300.

A heat sink 400 can be included on the housing 300 for dissipating heat to the surrounding environment. Because the housing 300 is formed of a heat conductive material, such as, e.g., Cu, the heat from the coolant 312 can be efficiently transferred to the heat sink 400. The heat sink 400 can include a fin structure to increase the surface of the heat sink 400 such that the heat from the housing 300 can be quickly dissipated to the environment. Because the heat sink 400 has this large surface area, heat will be effectively transported away from the housing 300, maintaining a low temperature of the housing 300.

Because the housing 300 temperature is low, the convective action 500 can be perpetuated with a substantially constant temperature difference between the semiconductor devices 200 and 201, and the housing 300. Thus, the semiconductor package 10 is a self-contained and self-regulating passive cooling system that leverages the convective action 500 of a liquid due to the temperature difference between the semiconductor devices 200 and 201, and the housing 300. Therefore, the semiconductor package 10 can be cheaply made with fewer failure points due to the elimination of active mechanisms for cooling the semiconductor devices 200 and 201. Furthermore, because of the simple nature of the semiconductor package 10, any repairs would be cheap and easy to perform.

The heat sink 400 can be formed on the top portion 302 of the housing 300, the one or more of the sidewalls 304, or on all surfaces of the housing 300, or any combination thereof. The heat sink 304 can include any material that is suitable for transporting heat from the housing 300 to the surrounding environment. Accordingly, the heat sink 400 can include, e.g., metals such as, e.g., Cu, among other suitable thermally conductive materials.

The heat sink 400 can be formed on the housing 300 by any suitable process for facilitating heat conduction, such as, e.g., attaching the heat sink 400 using a thermally conductive adhesive, welding, integrally forming the heat sink 400 with the housing 300, or by mechanical clamping via, e.g., clamps, screws, etc.

Figure 9:
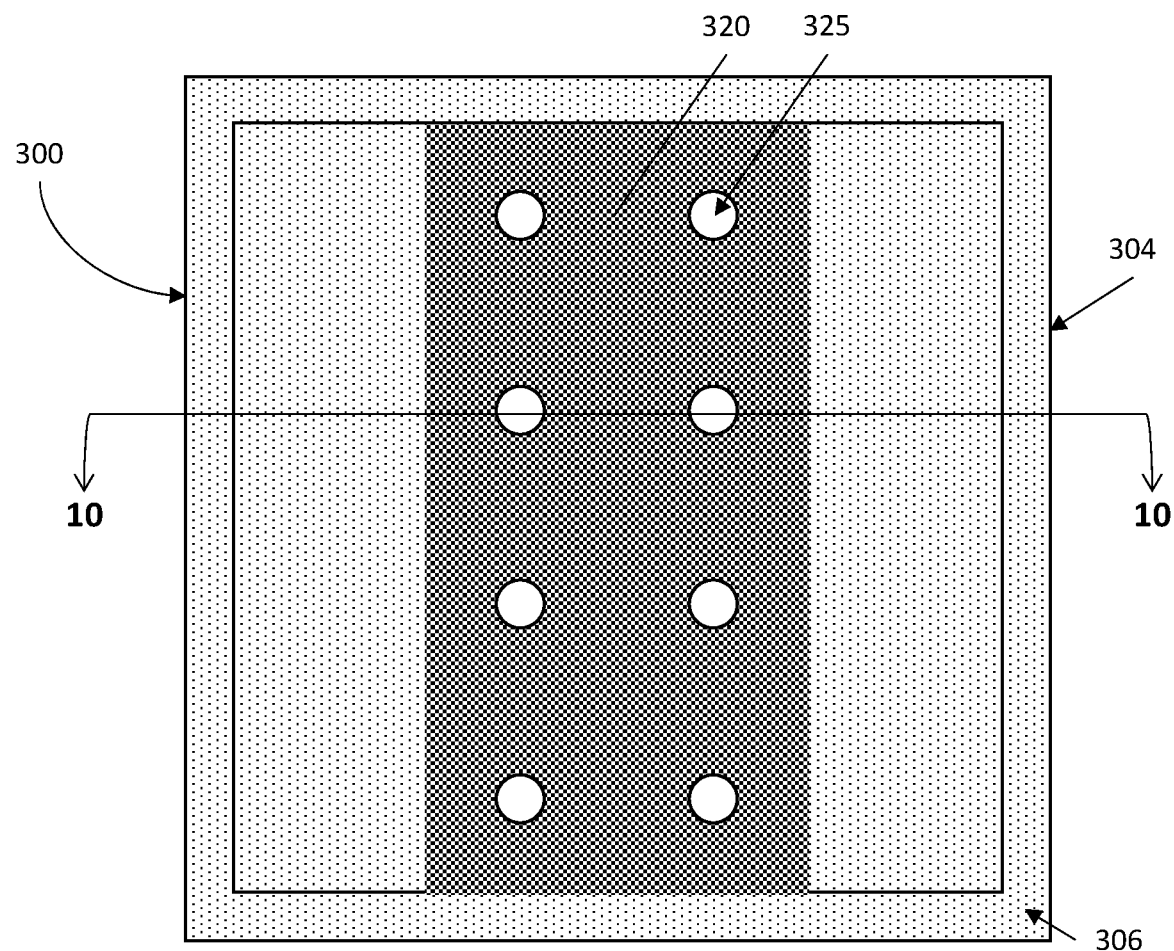
FIG. 9 is a bottom view showing a housing having convection channels, in accordance with an embodiment of the present invention.

Referring now to FIG. 9, a bottom view of a housing having convection channels is depicted in accordance with an embodiment of the present invention.

According to aspects of the present invention, the housing 300 can include a convection structure 320. The convection structure 320 is included within the internal cavity 310 of the housing 300 and designed to direct convective currents of the coolant 312. As such, the convection structure 320 can include multiple bottom holes 325 for directing cool fluid from the housing towards the semiconductor device 200 or devices 200 and 201.

The convection structure 320 can formed within the internal cavity 310 of the housing 300 by contacting the housing 300 on an interior side of two of the sidewalls 304. The convection structure 320 can, therefore, be either attached as a separate piece from the housing 300, or be integrally formed with the housing 300. If the convection structure 320 is separate from the housing, it can be attached using, e.g., an adhesive, a mechanical fastener, welding, or other suitable attachment means. Alternatively, the convection structure 320 can be integrally formed with the housing 300 via, e.g., a molding process, 3 dimensional printing, or other suitable process.

Figure 10:
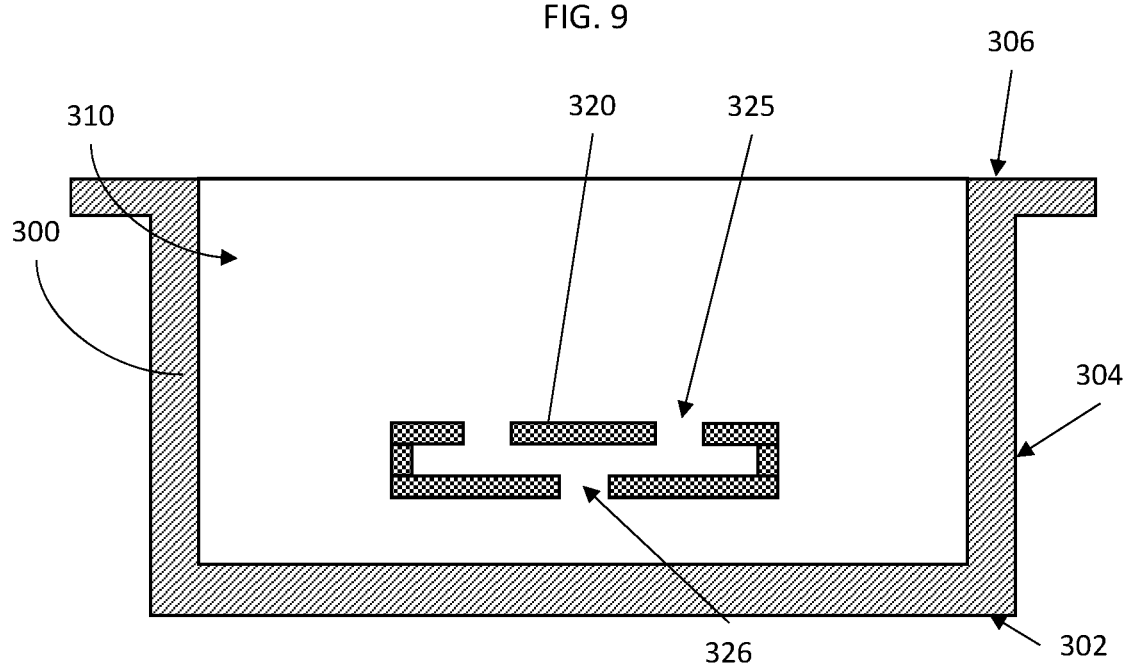
FIG. 10 is a cross-sectional view from line 10-10 of FIG. 9 showing the housing having convection channels, in accordance with an embodiment of the present invention.

Referring now to FIG. 10, a cross-sectional view from line 10-10 of FIG. 9 the housing of having convection channels is depicted in accordance with an embodiment of the present invention.

The convection structure 320 can be formed with a spaced relationship from the top portion 302 of the housing 300. Accordingly, fluid can flow between a top of the convection structure 320 and the top portion 302. Because the housing 300, including the top portion 302, will be relatively low in temperature, the fluid will tend to flow towards the warmer opposite side of the housing 300, where the semiconductor devices 200 and 201 are located (as discussed below). Thus, a top hole 326 is present to permit the fluid to flow through the convection structure 320 and through the bottom holes 325 and towards a device.

Any number of top holes 326 and bottom holes 325 can be used to assist convection. However, in one embodiment, two rows of circular bottom holes 325 are present and one row of circular top holes 326. Alternatively, the top holes 326 and bottom holes 325 can take the form of slits that extend from one sidewall 304 to the opposite sidewall 304 along the convection structure 320. Other arrangements are also contemplated, as well as combinations of arrangements.

Figure 11:
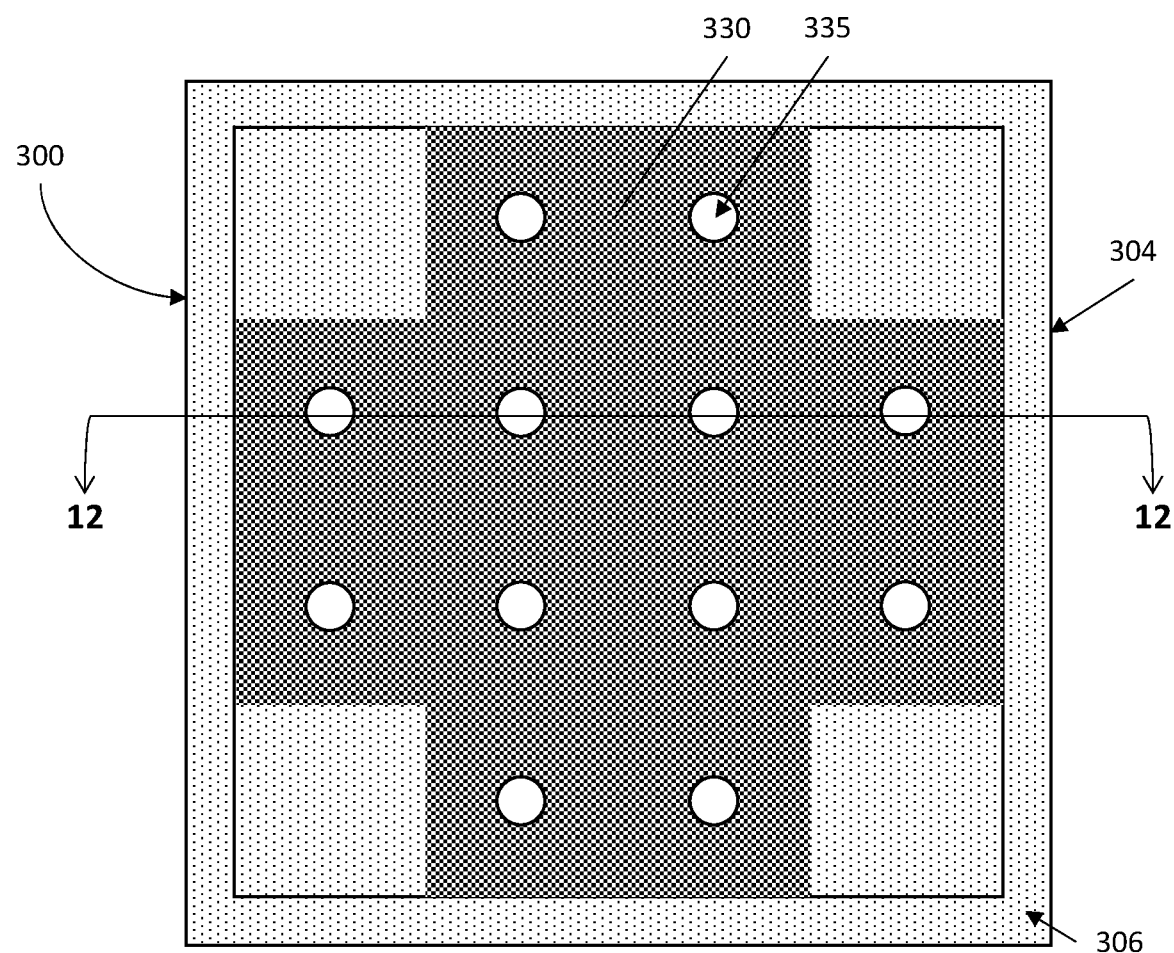
FIG. 11 is a bottom view showing a housing having convection channels, in accordance with an embodiment of the present invention.

Referring now to FIG. 11, a bottom view of a housing having convection channels is depicted in accordance with an embodiment of the present invention.

According to aspects of the present invention, the housing 300 can include a convection structure 330. The convection structure 330 is contained within the internal cavity 310 of the housing 300 and designed to direct convective currents of the coolant 312. As such, the convection structure 330 can include multiple bottom holes 335 for directing cool fluid from the housing towards the semiconductor device 200 or devices 200 and 201.

The convection structure 330 can formed within the internal cavity 310 of the housing 300 by contacting the housing 300 on an interior side of each of the sidewalls 304. The convection structure 330 can, therefore, be either attached as a separate piece from the housing 300, or be integrally formed with the housing 300. If the convection structure 330 is separate from the housing, it can be attached using, e.g., an adhesive, a mechanical fastener, welding, or other suitable attachment means. Alternatively, the convection structure 330 can be integrally formed with the housing 300 via, e.g., a molding process, 3 dimensional printing, or other suitable process.

Figure 12:
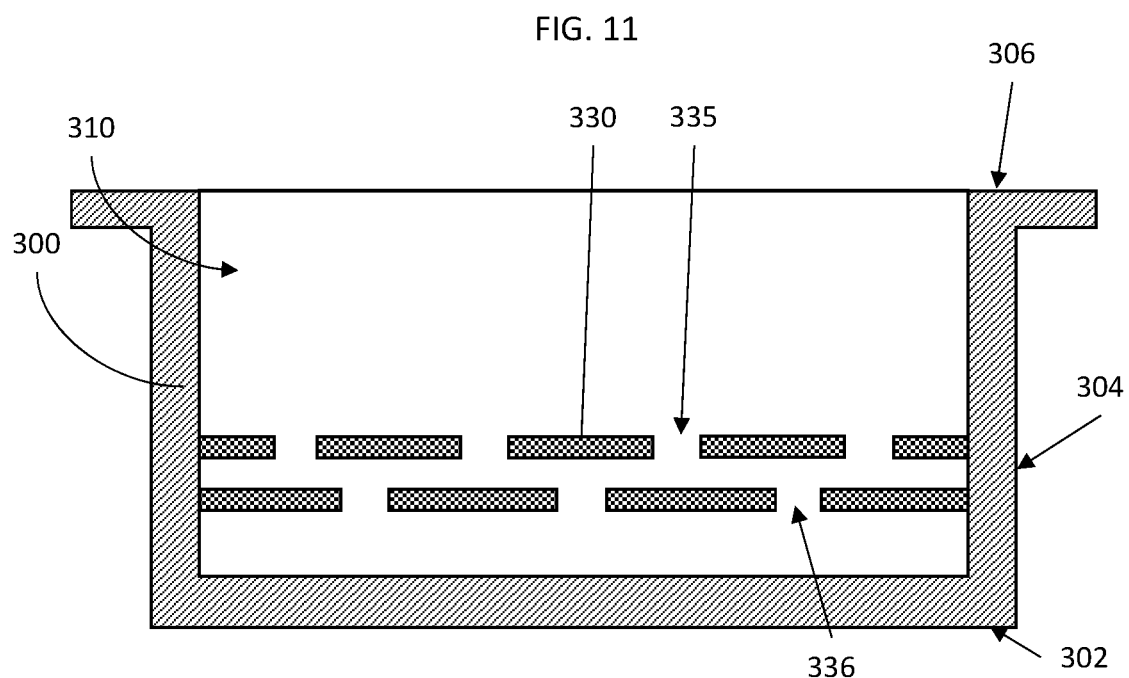
FIG. 12 is a cross-sectional view from line 12-12 of FIG. 11 showing the housing having convection channels, in accordance with an embodiment of the present invention.

Referring now to FIG. 12, a cross-sectional view from line 12-12 of FIG. 11 the housing of having convection channels is depicted in accordance with an embodiment of the present invention.

The convection structure 330 can be formed with a spaced relationship from the top portion 302 of the housing 300. Accordingly, fluid can flow between a top of the convection structure 330 and the top portion 302. Because the housing 300, including the top portion 302, will be relatively low in temperature, the fluid will tend to flow towards the warmer opposite side of the housing 300, where the semiconductor devices 200 and 201 are located (as discussed below). Thus, top holes 336 is present to permit the fluid to flow through the convection structure 330 and through the bottom holes 335 and towards a device.

Any number of top holes 336 and bottom holes 335 can be used to assist convection. However, in one embodiment, a grid of circular bottom holes 335 are present and a grid of circular top holes 336 are horizontally spaced between each of the circular bottom holes 335. Alternatively, the top holes 336 and bottom holes 335 can take the form of slits that extend from one sidewall 304 to the opposite sidewall 304 along the convection structure 330. Other arrangements are also contemplated, as well as combinations of arrangements.

Figure 13:
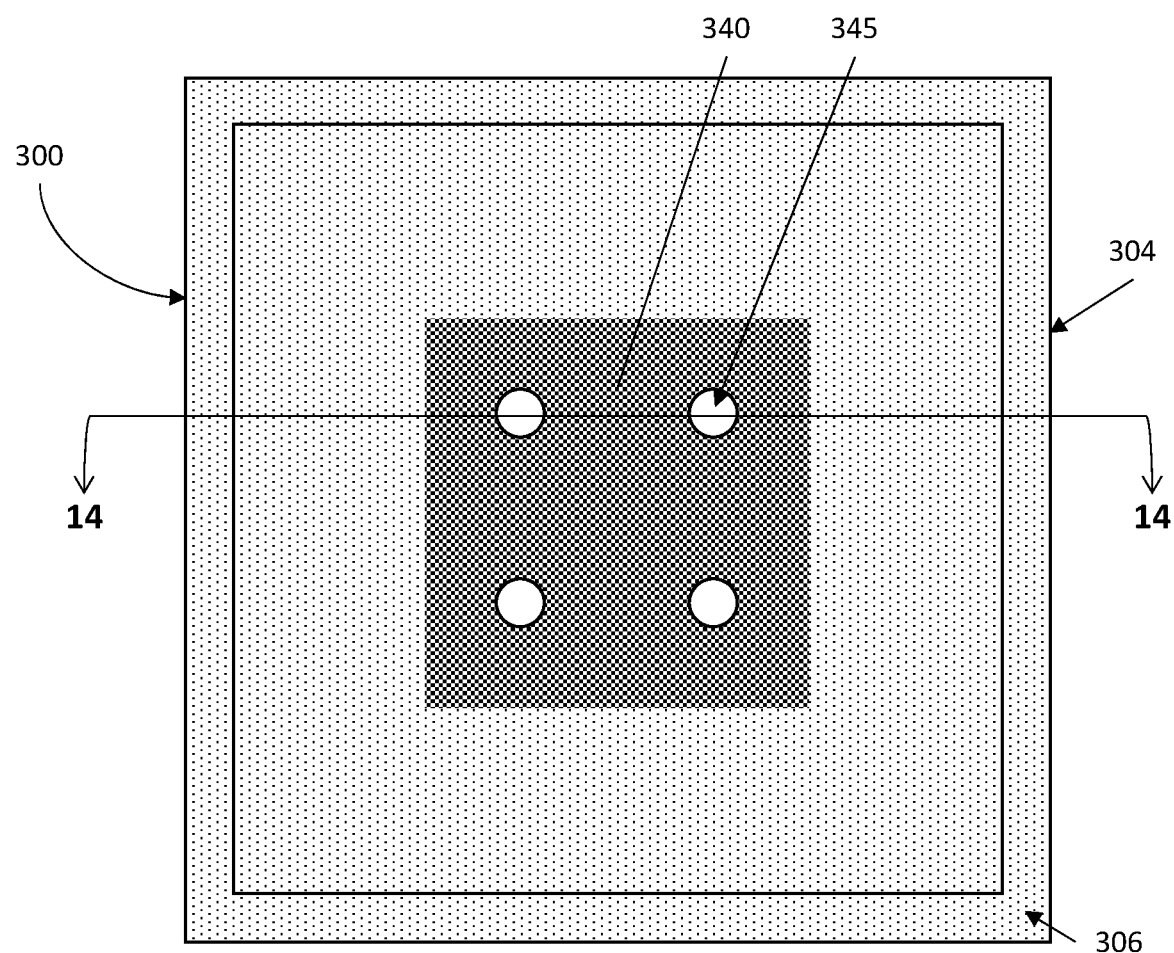
FIG. 13 is a bottom view showing a housing having convection channels, in accordance with an embodiment of the present invention.

Referring now to FIG. 13, a bottom view of a housing having convection channels is depicted in accordance with an embodiment of the present invention.

According to aspects of the present invention, the housing 300 can include a convection structure 340. The convection structure 340 is contained within the internal cavity 310 of the housing 300 and designed to direct convective currents of the coolant 312. As such, the convection structure 340 can include multiple bottom holes 345 for directing cool fluid from the housing towards the semiconductor device 200 or devices 200 and 201.

The convection structure 340 can formed within the internal cavity 310 of the housing 300 by mounting the convection structure 340 from the housing 300 on an interior side of the top portion 302. The convection structure 340 can, therefore, be either attached as a separate piece from the housing 300, or be integrally formed with the housing 300. If the convection structure 340 is separate from the housing, it can be attached using, e.g., an adhesive, a mechanical fastener, welding, or other suitable attachment means. Alternatively, the convection structure 340 can be integrally formed with the housing 300 via, e.g., a molding process, 3 dimensional printing, or other suitable process.

Figure 14:
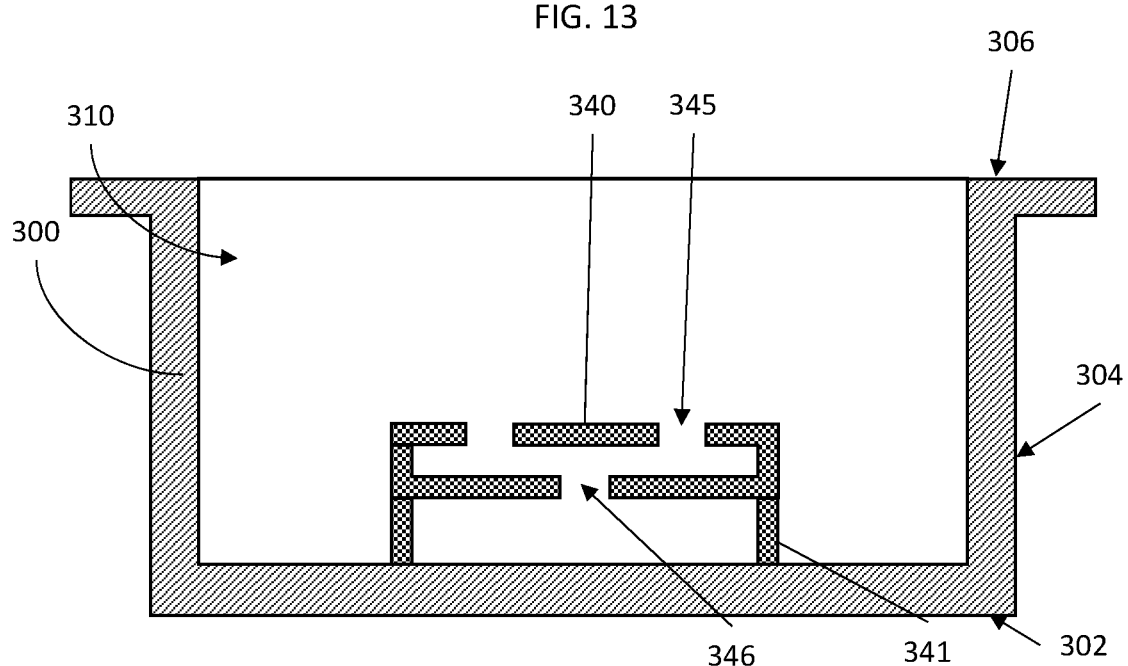
FIG. 14 is a cross-sectional view from line 14-14 of FIG. 13 showing the housing having convection channels, in accordance with an embodiment of the present invention.

Referring now to FIG. 14, a cross-sectional view from line 14-14 of FIG. 13 of the housing having convection channels is depicted in accordance with an embodiment of the present invention.

The convection structure 340 can be formed with a spaced relationship from the top portion 302 of the housing 300. Accordingly, fluid can flow between a top of the convection structure 340 and the top portion 302. The spaced relationship with the top portion 302 is maintained with posts 341 that attached the convection structure 340 to the top portion 302. The posts 341 can be, e.g., integrally formed with the convection structure 340 and are configured to permit fluid to flow between the convection structure 340 and the top portion 302 of the housing 300.

Because the housing 300, including the top portion 302, will be relatively low in temperature, the fluid will tend to flow towards the warmer opposite side of the housing 300, where the semiconductor devices 200 and 201 are located (as discussed below). Thus, top holes 346 is present to permit the fluid to flow through the convection structure 340 and through the bottom holes 345 and towards a device.

Any number of top holes 346 and bottom holes 345 can be used to assist convection. However, in one embodiment, a grid of four circular bottom holes 345 are present and central circular top hole 346 is horizontally located at a center between the circular bottom holes 345. Alternatively, the top holes 346 and bottom holes 345 can take the form of slits that extend from one side of the convection structure 340 to another, or as radial or circular slits. Other arrangements are also contemplated, as well as combinations of arrangements.

Figure 15:
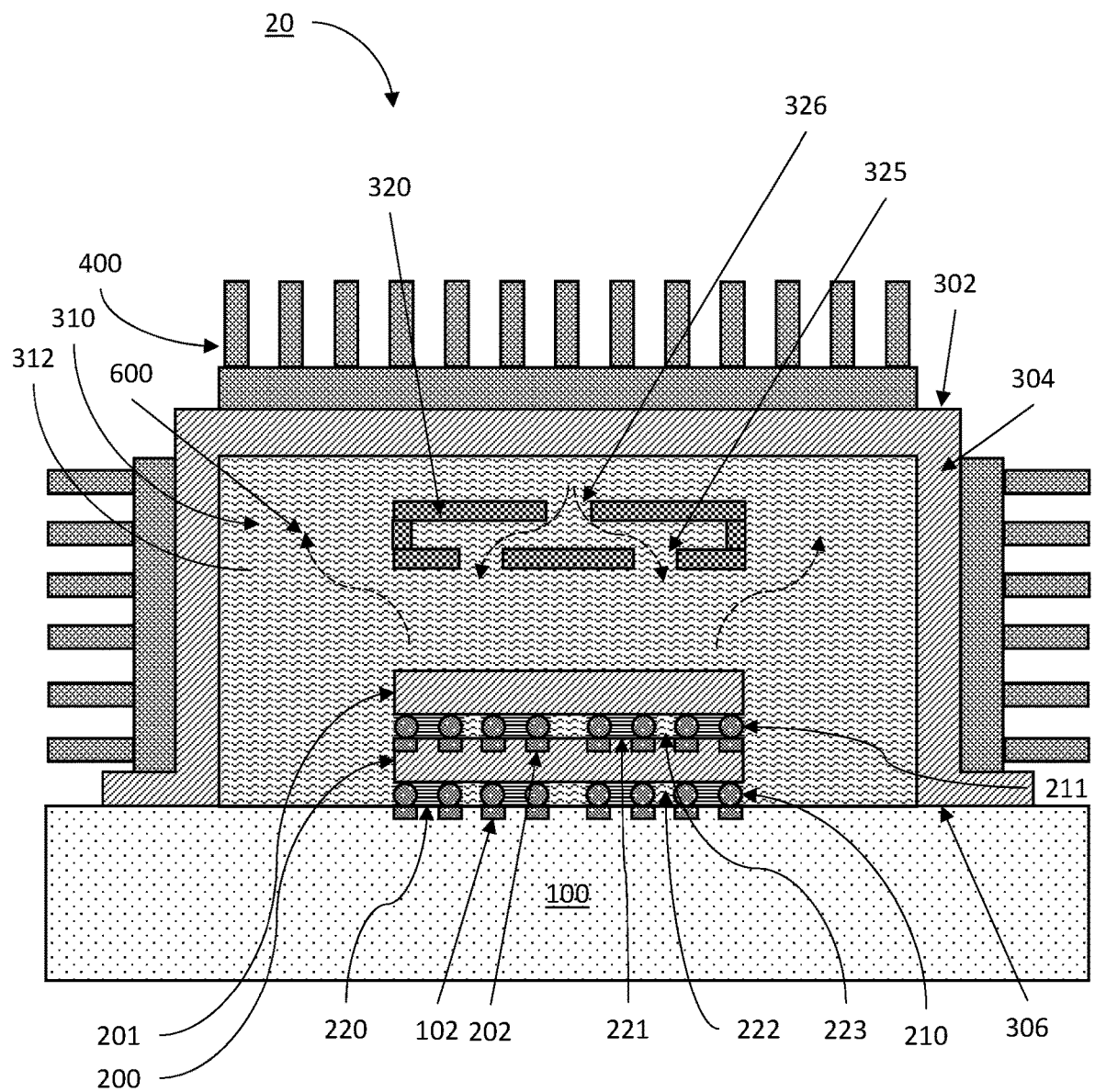
FIG. 15 is a cross-sectional view showing a semiconductor package having two stacked semiconductor devices in a fluid filled cavity of a housing having convection channels and a heat sink on the housing, in accordance with an embodiment of the present invention.

Referring now to FIG. 15, a cross-sectional view of a semiconductor package having two stacked semiconductor devices in a fluid filled cavity of a housing having convection channels and a heat sink on the housing is depicted in accordance with an embodiment of the present invention.

According to aspects of the present invention, a semiconductor package 20 includes a substrate 100, housing 300, heat sink 400 and semiconductor device 200 or devices 200 and 201 similar to the semiconductor device 10 of FIG. 8. Here, however, the housing 300 includes a convection structure 320. According to an embodiment of the present invention, the convection structure 320 is support by two of the sidewalls 304 of the housing 300, as discussed above. The convection structure 320 includes a centrally located top hole 326 and two laterally spaced bottom holes 325 such that, with respect to a horizontal axis, the top hole 326 is between the two bottom holes 325. Thus, the convection structure 320 can direct the flow of convective currents 600.

Coolant 312 will be heated by the semiconductor devices 200 and 201, as described above. The coolant 312 circulates due to convective action towards an area of lower temperature, such as the heat sink 400 located on the top portion 302 of the housing 300. Thus, the coolant 312 will follow a generally upward current from the semiconductor devices 200 and 201, around the convection structure 320, to the top portion 302. As the coolant 312 cools due to contact with the relatively lower temperature top portion 302, the coolant 312 follows a current towards the center of the top portion 302 where cool coolant 312 drains downwards through the top hole 326. Thus, the coolant 312 flows along the top portion 302, continually cooling until the coolant 312 reaches the top hole 326. The coolant 312 is drawn downwards through the top hole 326 due to displaced fluid of the resulting from the convective current 600.

The convection structure 320 splits the convection current 600 into at least two portions to exit at least two bottom holes 325. Therefore, the convection structure 320 diffuses the cool coolant 312 from the top portion 302, directing it downwards toward the semiconductor devices 200 and 201. Thus, cool coolant 312 comes into contact with the semiconductor devices 200 and 201 in a uniformly distributed fashion to more uniformly absorb heat from the semiconductor devices 200 and 201, thereby increasing the efficiency of convection in the self-contained semiconductor package 20.

Figure 16:
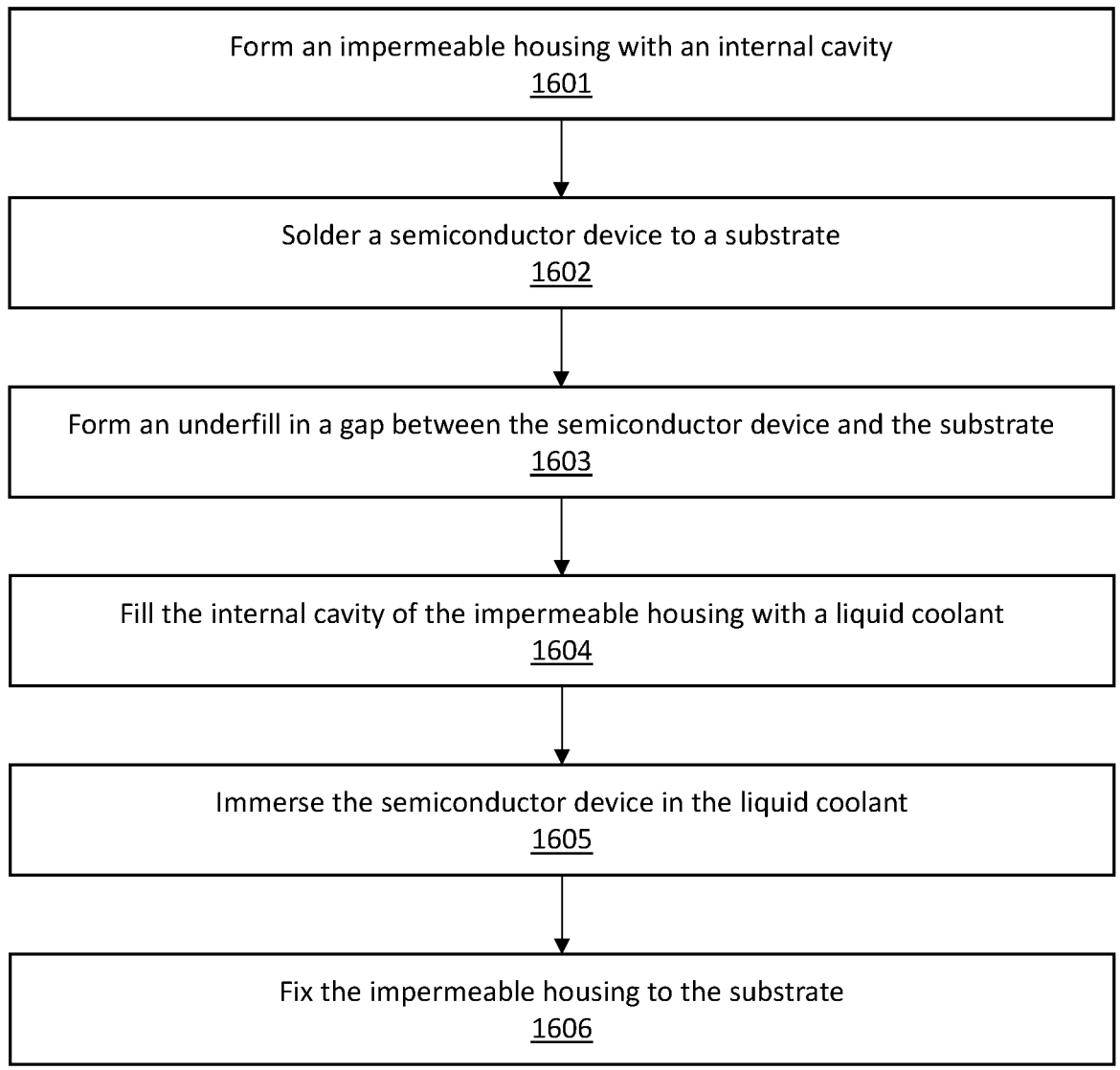
FIG. 16 is a block/flow diagram showing a system/method for forming a self-contained liquid cooled semiconductor package, in accordance with an embodiment of the present invention.

Referring now to FIG. 16, a block/flow diagram of a system/method for forming a self-contained liquid cooled semiconductor package is depicted in accordance with an embodiment of the present invention.

At block 1601, form an impermeable housing with an internal cavity.

The housing can be formed of a heat conducting material to transfer the temperature of the contents of the internal cavity to an outside environment. Accordingly, the housing can be formed of, e.g., a metal such as Cu. Additionally, the housing can be formed using a suitable method for shaping the heating conducting material, such as, e.g., 3 dimensional printing, molding, casting, welding, etc.

At block 1602, solder a semiconductor device to a substrate.

The semiconductor device can include contacts having solder balls. The solder balls can be melted against corresponding pads on the substrate to provide an electrical connection between the substrate and the semiconductor device, as well as attaching the semiconductor device to the substrate.

At block 1603, form an underfill in a gap between the semiconductor device and the substrate.

The underfill can be, e.g., a melted polymer that is flowed between the semiconductor device and the substrate and around the solder. Thus, the underfill provides physical and electrical protection to the semiconductor device and connections with the substrate. Therefore, the semiconductor package can be robust against physical and electrical shocks.

At block 1604, fill the impermeable housing with a liquid coolant.

At block 1605, immerse the semiconductor device in the liquid coolant.

Immersing the semiconductor device in the liquid coolant can include, e.g., first filling the internal cavity with the coolant and lowering the substrate towards an open side of the housing such that the semiconductor device is descended into the coolant contained therein. However, the semiconductor device can alternatively be immersed by, e.g., bringing the substrate into contact with the open side of the housing such that the semiconductor device is within the internal cavity. Then, a hole in the substrate or the housing can be used to, e.g., inject or pump the coolant into the internal cavity, thereby immersing the semiconductor device therein. Upon filling the internal cavity with coolant, the hole can be plugged or patched.

At block 1606, fix the impermeable housing to the substrate.

The impermeable housing can be fixed to the substrate in a suitable leak-tight manner. For example, the impermeable housing can be fixed to the substrate with an impermeable adhesive such as, e.g., an epoxy or a resin. Alternatively, the impermeable housing can be fixed to the substrate with, e.g., a clamp, bolt, screw, or other mechanical fastener. The mechanical fastener can be combined with a gasket or seal around a rim of the impermeable housing at an interface with the substrate to provide improved impermeability.

Having described preferred embodiments of a system and method for a self-contained liquid cooled semiconductor package (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A liquid cooled semiconductor package comprising: at least one semiconductor device on a substrate;
an impermeable housing with an internal cavity positioned around the at least one semiconductor device, wherein the impermeable housing is affixed to the substrate:
a liquid coolant within the internal cavity such that the liquid coolant immerses the at least one semiconductor device; and
at least one convection structure extending inwardly from at least one interior surface of the impermeable housing, wherein the convection structure includes a first wall and a second wall opposite the first wall and separated from the first wall by a distance, wherein the first wall and the second wall each have one or more holes configured to direct the flow of liquid coolant within the impermeable housing, wherein the at least one semiconductor device is disposed outside the convection structure.

2. The semiconductor package as recited in claim 1, wherein the convection structure is supported by two sidewalls of the impermeable housing.

3. The semiconductor package as recited in claim 1, wherein the convection structure is integrally formed within the impermeable housing.

4. The semiconductor package as recited in claim 1, further including a heat sink disposed on at least one exterior surface of the impermeable housing.

5. The semiconductor package as recited in claim 1, wherein the at least one semiconductor device includes:
a first semiconductor device having a first side mounted to the substrate; and
a second semiconductor device mounted to a second side of the first semiconductor device opposite to the first side.

6. The semiconductor package as recited in claim 5, further comprising:
an underfill between the first semiconductor device and the second semiconductor device.

7. The semiconductor package as recited in claim 1, wherein the semiconductor package is a self-contained and self-regulating passive cooling system devoid of fluid inlets, fluid outlets and mechanisms for circulating fluid.

8. The semiconductor package as recited in claim 1, wherein the at least one semiconductor device is soldered to the substrate using solder ball contacts.

9. The semiconductor package as recited in claim 1, further including an underfill in a gap between the at least one semiconductor device and the substrate.

10. The semiconductor package as recited in claim 9, wherein the underfill includes channels extending across the at least one semiconductor device to permit flow of the coolant between the substrate and that at least one semiconductor device.

11. The semiconductor package as recited in claim 1, wherein the impermeable housing is affixed to the substrate using a liquid-tight adhesive.

12. The semiconductor package as recited in claim 1, wherein the impermeable housing is affixed to the substrate using a mechanical fastener with a gasket on a rim of the impermeable housing.

13. A liquid cooled semiconductor package comprising:
   a first semiconductor device;
   a second semiconductor device soldered onto the first semiconductor device; an impermeable housing containing a liquid coolant that fills an internal cavity, wherein the first semiconductor device and the second semiconductor device are immersed in the coolant; and
   a convection structure extending inwardly from at least one interior surface of the impermeable housing, wherein the convection structure includes a first wall and a second wall opposite the first wall and separated by a distance, wherein the first wall and the second wall each have one or more holes for directing convective currents of the coolant disposed within the internal cavity of the impermeable housing such that the convective currents are directed from the first semiconductor device and second semiconductor device around the convection structure, across a top portion of the impermeable housing, and back towards the first semiconductor device and the second semiconductor device, wherein the first semiconductor device and the second semiconductor device are disposed outside the convection structure.

14. The semiconductor package as recited in claim 13, wherein the convection structure includes a centrally located top hole in the first wall and laterally spaced bottom holes in the second wall, wherein the centrally located top hole is disposed between the laterally spaced bottom holes with respect to a horizontal axis.

15. The semiconductor package as recited in claim 14, wherein the convection structure is integrally formed within the impermeable housing.

16. The semiconductor package as recited in claim 14, further including a heat sink disposed on at least one exterior surface of the impermeable housing.

17. The semiconductor package as recited in claim 14, wherein an underfill in a gap between the first semiconductor device and the substrate includes channels extending across the first semiconductor device to permit flow of the coolant between the substrate and the first semiconductor device.

18. A method for forming a semiconductor package, the method comprising:
   filling an internal cavity of an impermeable housing with a liquid coolant, wherein the impermeable housing includes a convection structure extending inwardly from at least one interior surface of the impermeable housing, wherein the convection structure includes a first wall and a second wall opposite the first wall and separated by a distance, and wherein the first wall and the second wall each have one or more holes configured to direct a flow of the liquid coolant; and
   affixing a substrate with a semiconductor device mounted on the substrate to the impermeable housing, wherein the impermeable housing is around the semiconductor device and the semiconductor device is disposed outside the convection structure.

19. The method of claim 18, wherein the internal cavity of the impermeable housing is filled with the liquid coolant after affixing the substrate to the impermeable housing.

\* \* \* \* \*